US008219871B2

(12) United States Patent
Roetteler (10) Patent No.: US 8,219,871 B2
(45) Date of Patent: Jul. 10, 2012

(54) EFFICIENT DECOUPLING SCHEMES FOR QUANTUM SYSTEMS USING SOFT PULSES

(75) Inventor: Martin Roetteler, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 1057 days.

(21) Appl. No.: 12/050,566

(22) Filed: Mar. 18, 2008

(65) Prior Publication Data
US 2009/0241013 A1 Sep. 24, 2009

(51) Int. Cl.
*H03M 13/00* (2006.01)
(52) U.S. Cl. .......................................................... 714/752
(58) Field of Classification Search ................... 714/752
See application file for complete search history.

(56) References Cited

U.S. PATENT DOCUMENTS

| | | | |
|---|---|---|---|
| 5,196,795 | A | 3/1993 | Bodenhausen et al. |
| 5,323,344 | A | 6/1994 | Katayama et al. |
| 5,768,297 | A | 6/1998 | Shor |
| 5,917,322 | A | 6/1999 | Gershenfeld et al. |
| 6,128,764 | A | 10/2000 | Gottesman |
| 6,317,766 | B1 | 11/2001 | Grover |
| 6,563,311 | B2 | 5/2003 | Zagoskin |
| 7,184,555 | B2 | 2/2007 | Whaley et al. |
| 7,307,275 | B2 | 12/2007 | Lidar et al. |
| RE40,281 | E * | 4/2008 | Tzannes et al. ............... 704/205 |
| 2003/0005010 | A1* | 1/2003 | Cleve et al. .................... 708/403 |
| 2004/0000666 | A1 | 1/2004 | Lidar et al. |
| 2004/0238813 | A1 | 12/2004 | Lidar et al. |
| 2005/0055387 | A1* | 3/2005 | Kuekes et al. ..................... 708/1 |
| 2005/0062072 | A1 | 3/2005 | Yamamoto et al. |
| 2005/0133780 | A1 | 6/2005 | Azuma |
| 2006/0010187 | A1 | 1/2006 | Brown et al. |

FOREIGN PATENT DOCUMENTS

WO WO2004/884132 9/2004

OTHER PUBLICATIONS

Michael J. Flynn, "Computer Architecture, Pipelined and Parallel Processor Design", Jones and Bartlett Publishers, Inc. 1995.*
Parkhomenko, "Classification of the Hamiltonian Cycles in Binary Hypercubes", Automation and Remote Control vol. 62 No. 6 2001.*

(Continued)

*Primary Examiner* — Robert Beausoliel, Jr.
*Assistant Examiner* — Neil Miles
(74) *Attorney, Agent, or Firm* — James Bitetto; Joseph Kolodka (57) ABSTRACT

A system and method for dynamical decoupling of a quantum system includes forming a graph including elements to account for decoupling sequence effects represented as nodes in the graph and soft pulses applied being represented as edges in the graph. Sequences which visit edges and nodes in the graph are provided. Binary strings corresponding to the nodes in a coordinate system are mapped using a fixed linear error correcting code. A decoupling method is provided based upon a matrix formed using the error correcting code to determine features of the soft pulses to decouple environmental effects from the quantum system.

20 Claims, 9 Drawing Sheets

OTHER PUBLICATIONS

Sengupta, Pinaki, et al. Scalable design of tailored soft pulses for coherent control. Physical review letters, Jul. 2005, vol. 95, No. 3, p. 037202-1 and 037202-4.

Pryadko, L.P., et al. Soft-pulse dynamical decouplingin a cavity. Physical review. A. Jan. 2008, vol. 77, No. 1, p. 012330-1 and 012330-9.

A.O. Niskanen, et al., "Quantum coherent tunable couplings of superconducting qubits," Science, vol. 316; 2007; pp. 723-726.

M. Roetteler, et al., "Equivalence of Decoupling schemes and orthogonal arrays," IEEE Transactions on Information Theory, vol. 52, N. 9; 2006; pp. 4171-4181.

L. Viola, et al., "Robust dynamical decoupling of quantum systems with bounded controls," Phys. Rev. Letters, vol. 90, No. 3, 2003; pp. 037901-1-037901-4.

P. Wocjan, "Efficient decoupling schemes with bounded controls based on Eulerian arrays," Phys. Rev. A, vol. 73, 2006; pp. 062317-1-062317-7.

* cited by examiner

FIG. 9

EFFICIENT DECOUPLING SCHEMES FOR QUANTUM SYSTEMS USING SOFT PULSES

BACKGROUND

1. Technical Field

The present invention relates to quantum computing, and more particularly to systems and methods for decoupling quantum systems to improve efficiency and reliability of storage of quantum information by dynamical noise suppression techniques.

2. Description of the Related Art

Quantum computers show great promise to far surpass the capabilities of classical computers. However, a major problem with the actual physical realization of a quantum computer is that any quantum system is invariably connected to an environment which causes errors to the computer and, in the worst case, can render the quantum computer useless. Therefore, techniques are needed which a) shield the quantum computer from the environment, b) encode the quantum computer's memory into suitable subspaces by introducing redundancy similar to classical error-correcting codes, and c) provide mechanisms which can be used to suppress noise dynamically by repeatedly applying control operations to the system to drive the system to some stable state.

One major problem is keeping the components of the computer in a coherent state, as the slightest interaction with the external world would cause the system to decohere. This effect causes the unitary character (and more specifically, the invertibility (reversibility)) of quantum computational steps to be violated.

Prior efforts address the problem of dynamical noise suppression using very strong pulses, called hard pulses, which have to be applied to the system at precisely known times. However, pulses with this property are unrealistic from an experimental point of view. There have been efforts to realize dynamical noise suppression with soft pulses; however, such proposed methods do not scale well in terms of a number of pulses that have to be applied to the system.

SUMMARY

The present invention addresses dynamical noise suppression techniques and introduces a new way of constructing such schemes efficiently.

A system and method for dynamical decoupling of a quantum system includes forming a graph including elements to account for decoupling sequence effects represented as nodes in the graph and soft pulses applied being represented as edges in the graph. Sequences which visit edges and nodes in the graph are provided. Binary strings corresponding to the nodes in a coordinate system are mapped using a fixed linear error correcting code. A decoupling method is provided based upon a matrix formed using the error correcting code to determine features of the soft pulses to decouple environmental effects from the quantum system.

A quantum system with dynamical decoupling includes a program storage device configured to form a graph including elements to account for a decoupling sequence effects represented as nodes in the graph and soft pulses applied being represented as edges in the graph. A sequence generator generates sequences to visit edges and nodes in the graph in accordance with an Eulerian cycle. A fixed linear error correcting code is configured to map binary strings corresponding to the nodes in a coordinate system. A decoupling matrix is generated based upon a matrix formed using the error correcting code to determine features of the soft pulses where each column of the matrix corresponds to the elements to account for the decoupling sequence effects represented as the nodes. A pulse generator is configured to generate soft pulses in accordance with the matrix to suppress environmental effects on the quantum system.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present embodiments permit enhancement of quantum computer memory with a higher level of protection from noise introduced by the environment. The present embodiments may also be used for simulating time evolution of a quantum system with the help of a quantum computer. The simulation problem is one of the main applications for quantum computers since this cannot be done efficiently even on classical supercomputers.

The ability to simulate large dimensional quantum systems would have great value for academic and industrial purposes. One field to which the present principles can be applied is the field of liquid state nuclear magnetic resonance (NMR) which currently is one of the most-advanced techniques to implement practical quantum computers. In another embodiment, the disclosed method is applied to solid state NMR systems. Another embodiment concerns quantum systems comprised of superconducting circuits based on a Josephson Junction, which can be found in low temperature superconductors such as $Al/AlO_x$ superconductors. The methods disclosed can also be applied to other types of superconducting qubits such as certain types of high $T_c$ cuprate superconductors. In addition to NMR systems, the present principles may be beneficial for pulse shaping challenges which arise in the design of decoupling sequences for general systems of qubits.

A quantum computer is any computation device making direct use of distinctively quantum mechanical phenomena, such as, e.g., superposition and entanglement, to perform operations on data. In a classical (or conventional) computer, information is stored as bits; in a quantum computer, it is stored as qubits (quantum bits). The basic principle of quantum computation is that the quantum properties can be used to represent and structure data, and that quantum mechanisms can be devised and built to perform operations with this data.

In particularly useful embodiments, dynamical decoupling schemes are introduced which are realized by applying pulses to the quantum system. While a number of pulses needed is small compared to the number of qubits and the pulses can be implemented as soft pulses, there nevertheless remains the task of implementing the soft pulses. While such pulses are feasible in theory, the practical implementation is challenging since the soft pulse need the simultaneous operation on several spins of the system. In Nuclear Magnetic Resonance (NMR) quantum computing, it has been shown that it is possible to apply such composite pulses in systems of small size. For larger sizes it may require further experimental success in controlling and addressing the spins, e.g., by improved radio-frequency techniques in NMR.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

A system and method are provided and illustratively described which permit implementation of dynamical noise suppression for quantum systems. This protects the quantum system against noise caused by unwanted interactions between the system and its environment. So far the design of such decoupling schemes was based on the ability to apply sequences of arbitrary strong and arbitrary short pulses (hard pulses) to the system's qubits. In the presence of strong pulses, it is essentially a combinatorial problem to derive such schemes and it is known that their existence is equivalent to so-called orthogonal arrays, which themselves can be seen as a generalization of linear error-correcting codes.

Figure 1:
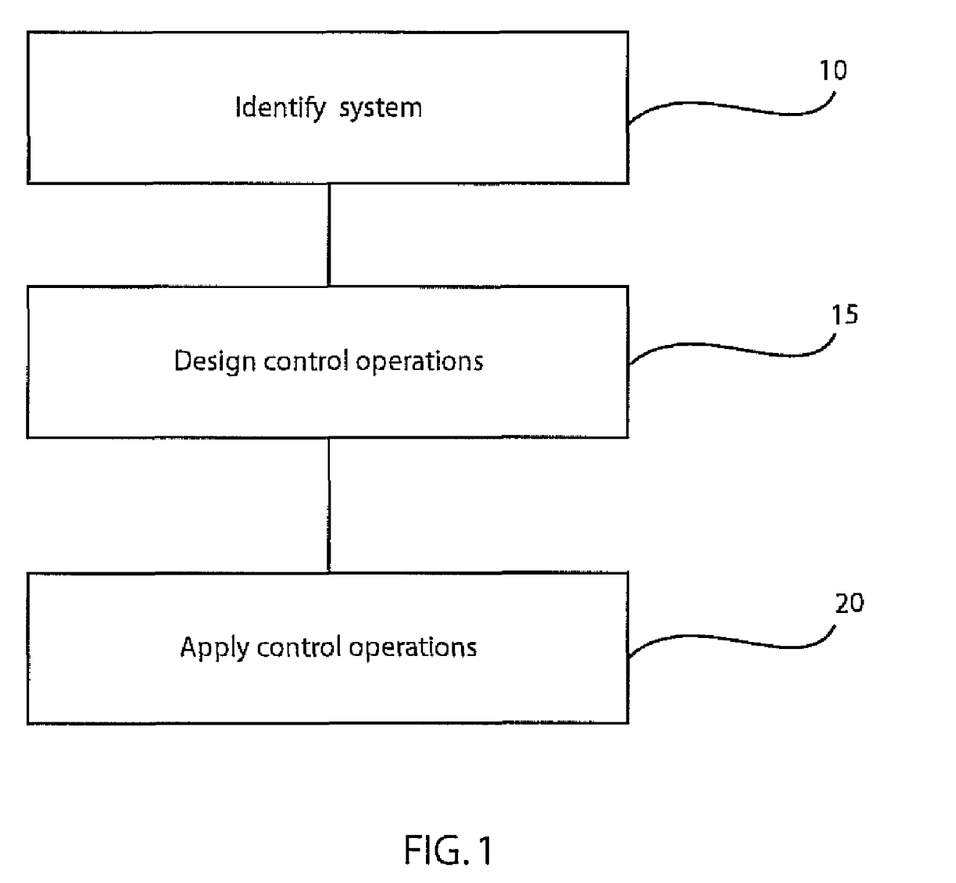
FIG. 1 is a block/flow diagram showing a high-level system/method for decoupling quantum systems.

Referring now to the drawings in which like numerals represent the same or similar elements and initially to FIG. 1, a block/flow diagram shows a system/method for deriving a sequence for dynamical decoupling using soft pulses in accordance with the present principles. In block 10, a system Hamiltonian (H) of the given system is identified. For this, a complete and detailed knowledge of the strengths of the interactions between the qubits is not required. For successful application of the method described here, it is sufficient to know that the system Hamiltonian has only couplings of a certain order, for example, Hamiltonians with pair-interaction terms only, such as those arising in NMR (in the embodiment of liquid state NMR only ZZ interactions can arise, in another embodiment of solid state NMR also homonuclear and heteronuclear dipole-dipole interactions can occur).

In block 15, given the knowledge about the system Hamiltonian, a suitable periodic sequence of pulses is generated. This design process takes into account the specific nature of the system Hamiltonian identified in block 10. The types of sequences disclosed here may be derived from classical error-correcting codes such as the Hamming codes. The pulses may be obtained by mapping codewords of the error-correcting code into a fixed and small class of pulses which then in turn can be applied to a physical system in the form of unitary single qubit operations. The design of the sequence has to meet some criteria to achieve decoupling (See, e.g., Roetteler and Wocjan, IEEE-IT 2006). Moreover, the design of the sequence has to meet certain additional criteria to achieve decoupling when the pulses applied are soft pulses.

In block 20, the pulses derived in block 15 are applied as a train or periodic sequence of pulses (e.g., as radio frequency (RF) pulses in the case of NMR systems or as resonant microwave pulses in case of embodiments in the form of superconducting qubits). More details about the application of the sequence are given with reference to FIG. 2.

Figure 2:
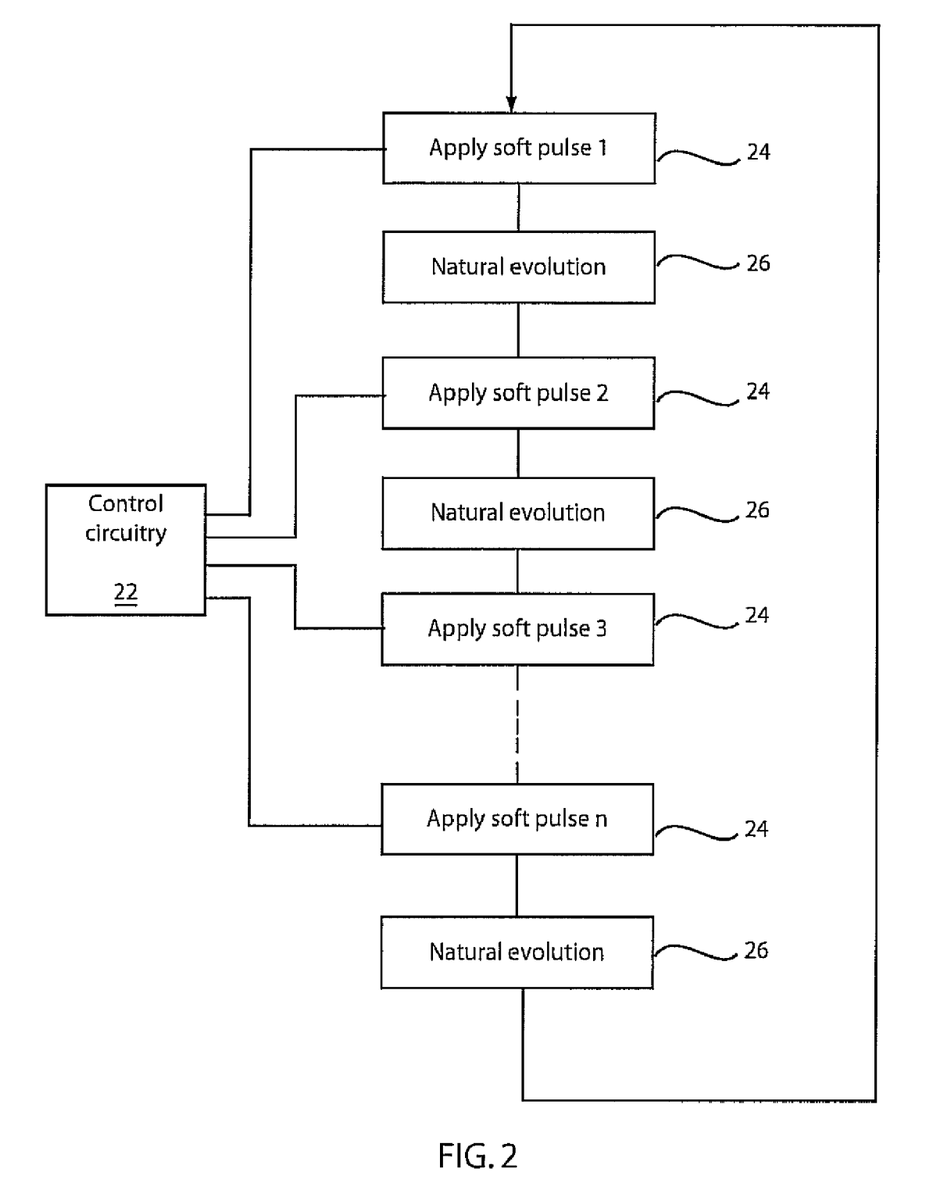
FIG. 2 is a block/flow diagram showing soft pulse generation in accordance with the present principles.

Referring to FIG. 2, a block/flow diagram shows a pulse generator in accordance with the present principles. A control circuit 22 generates a sequence of pulses (e.g. RF pulses in the case of NMR systems or microwave pulses in case of superconducting flux qubits). Soft pulses are applied in blocks 24 to a physical system. This is done by slowly ramping on a control parameter (e.g., strength of an RF field for certain frequency in case of NMR, or parametric modulation of the coupling energy of superconducting qubits at the appropriate frequency). This is done within the admissible ranges thereby avoiding the need for very fast and strong pulses.

In blocks 26, a natural time evolution of the system (H) for a time $\Delta t$ is given by a unitary operator $e^{\{-iH/\Delta t\}}$. The Hamilton describes the physical system and can be, e.g., of ZZ-type in the case of a liquid state NMR or, for the case of superconducting flux qubits, of the form:

$$H_{rot} = \sum_{j=1}^{2} \frac{\Omega_j}{2}(\cos\phi_j \sigma_x^j - \sin\phi_j \sigma_y^j) + \frac{\Omega_{12}}{4}(\sigma_x^1 \sigma_x^2 - \sigma_y^3 \sigma_y^4).$$

The above equation shows the Hamiltonian for the natural coupling between two superconducting flux qubits. Here, $\Omega_j$ is the resonant microwave-induced single qubit Rabi frequency of qubit j. A typical value for $\Omega_j$ for a superconducting flux qubit system, realized as an Al/AlO$_x$ low temperature superconducting circuit with Josephson Junctions, is between 4 and 7 GHz. Further, $\phi_j$ is the microwave phase, a real number between 0 and $2\pi$, and $\sigma_x$ and $\sigma_y$ are Pauli spin matrices. Controllable coupling between the qubits is achieved using the term $\Omega_{12}$ in the Hamiltonian which can be used to drive the sum-frequency transition. A typical frequency for the term $\Omega_{12}$ is between 20 and 25 MHz.

The sequence described above includes the application of n suitably chosen pulses in blocks 24 which have to meet certain design criteria to achieve decoupling of the qubits. The sequence is cyclic, i.e., it repeats itself from the beginning once all n soft pulses have been applied. This iterative process has to be repeated as long as the quantum computer is operated and decoupling of the qubits is desired.

Figure 3:
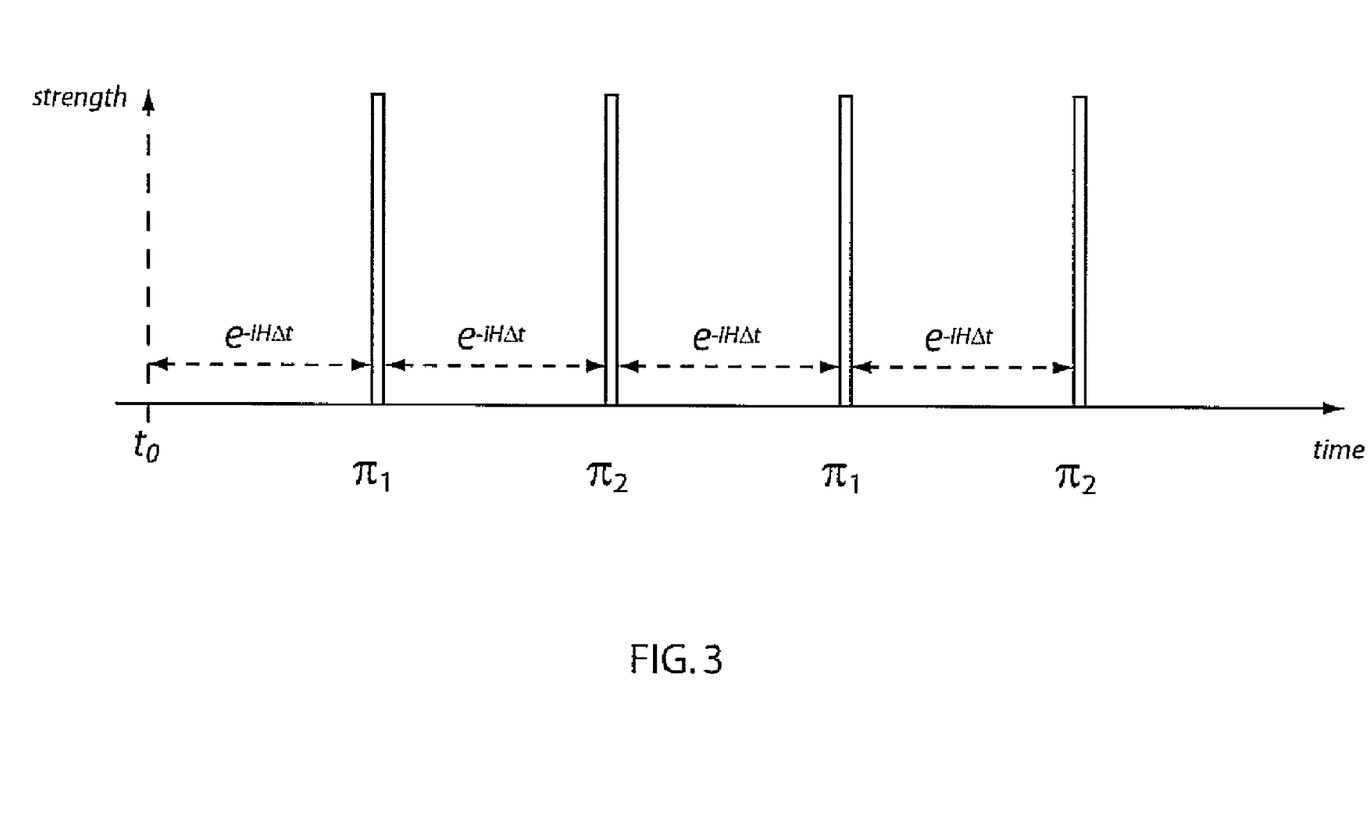
FIG. 3 is a plot of hard pulses in accordance with one decoupling scheme.

Referring to FIG. 3, qualitatively, a pulse sequence is shown for hard pulses. In the case shown in FIG. 3, two different pulses, denoted by $\pi_1$ and $\pi_2$, are applied. In general, these pulses are composite pulses. This means that to implement them several rotations to the underlying qubits might have to be applied simultaneously. The fact that the pulses are hard is indicated by a very short duration (ideally arbitrary short) and very high strength of control interaction (ideally arbitrary strong).

In the time between the pulses the system is evolving according to its natural time evolution, given by $e^{-iH\Delta t}$, where we assume that the interaction Hamiltonian is H and that it is applied for time $\Delta t$. The basic goal of all decoupling schemes is to design the pulses, here $\pi_1$ and $\pi_2$, in such a way that the effective time evolution of the whole sequence of natural time evolutions interspersed with pulses is the zero Hamiltonian, i.e., in first order approximation there is no interaction with the environment.

Figure 4:
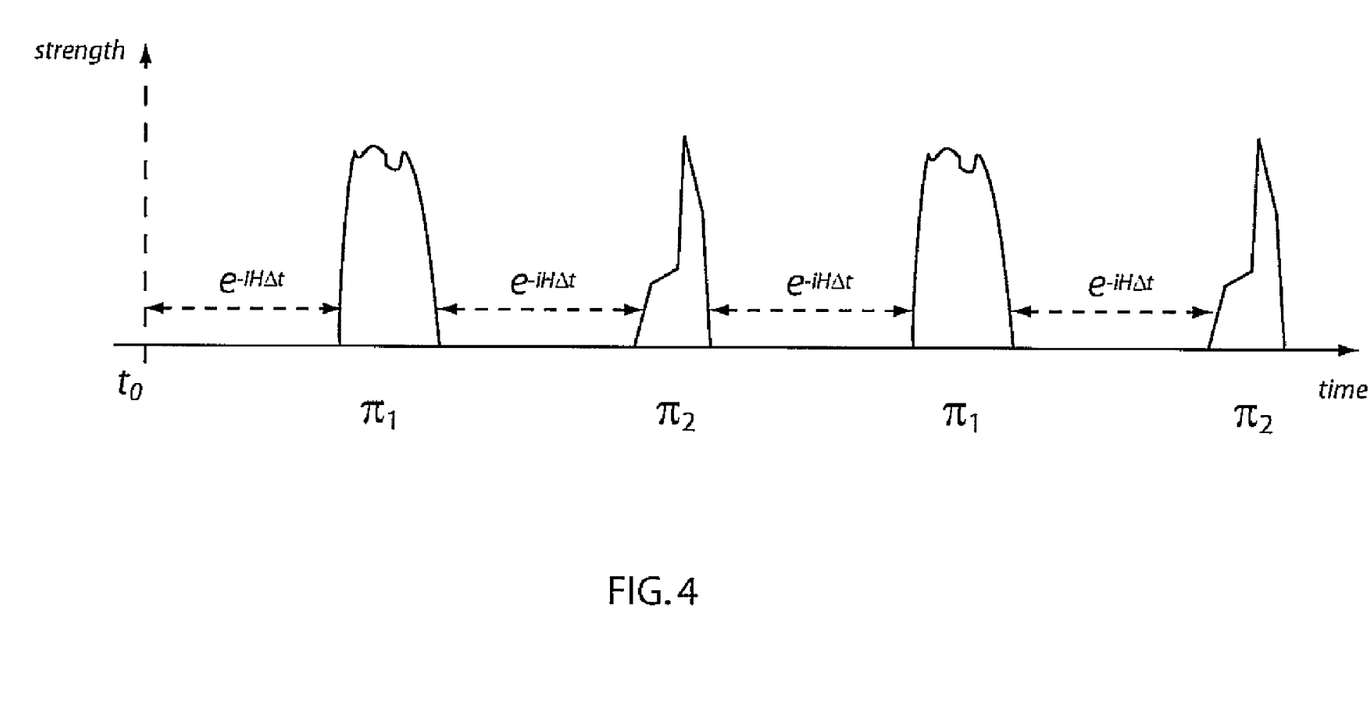
FIG. 4 is a plot of soft pulses employed for a decoupling scheme in accordance with the present principles.

Instead of hard pulses, soft pulses are employed in accordance with the present principles. Soft pulses arise in situations in which there is only bounded control possibility over the system. Mathematically, a hard pulse can be any local unitary operation on the system's qubits. In contrast, soft pulses are modeled by introducing a time dependent control propagator $H_c(t)$. The corresponding soft pulse may then be given by:

$$U_c(t) = T\exp\left\{-i\int_{t_0}^{t} H_c(\tau)d\tau\right\},$$

where T denotes time ordering. The strength of a pulse can be defined as the operator norm $\|H_c(\tau)\|$.

Referring to FIG. 4, a qualitative picture of a sequence of soft pulses is illustratively shown. One difference with hard pulses is that the soft pulses now have a finite width and a bounded strength. Also, in the course of their implementation the control propagator $H_c(t)$ may vary quite substantially over time, perhaps outside the precise control of the experimentalist. In accordance with the present principles, whenever a full cycle of length $\delta$ has been completed, the implemented transformation should satisfy $U_c((j-1)\delta+\tau)=\pi_j$, where $\pi_j$ denotes the corresponding pulse.

In prior art it has been shown by Viola and Knill in "Robust dynamical decoupling of quantum systems with bounded controls", Phys. Rev. Letters, vol. 90, no. 3, 2003, incorporated herein by reference) how to use schemes defined by soft pulses to achieve dynamical decoupling. The idea is to impose an algebraic structure of a finite group onto the set of possible pulses. Furthermore, in Viola et al., a Cayley graph is introduced for the group generated by the pulses and this graph was shown to have an Eulerian cycle, i.e., a tour on the graph which visits each edge exactly once.

Viola et al. introduce decoupling schemes based on soft pulses by using a highly symmetric averaging technique. This technique is based on putting the pulses in correspondence with the nodes of Eulerian cycles in a certain Cayley graph. By applying the pulses in the order dictated by the Eulerian cycle, the imprecision due to the softness of the pulses gets averaged away by the decoupling scheme. The schemes proposed by Viola et al. scale poorly (namely exponentially) with increasing number of qubits.

Figure 5:
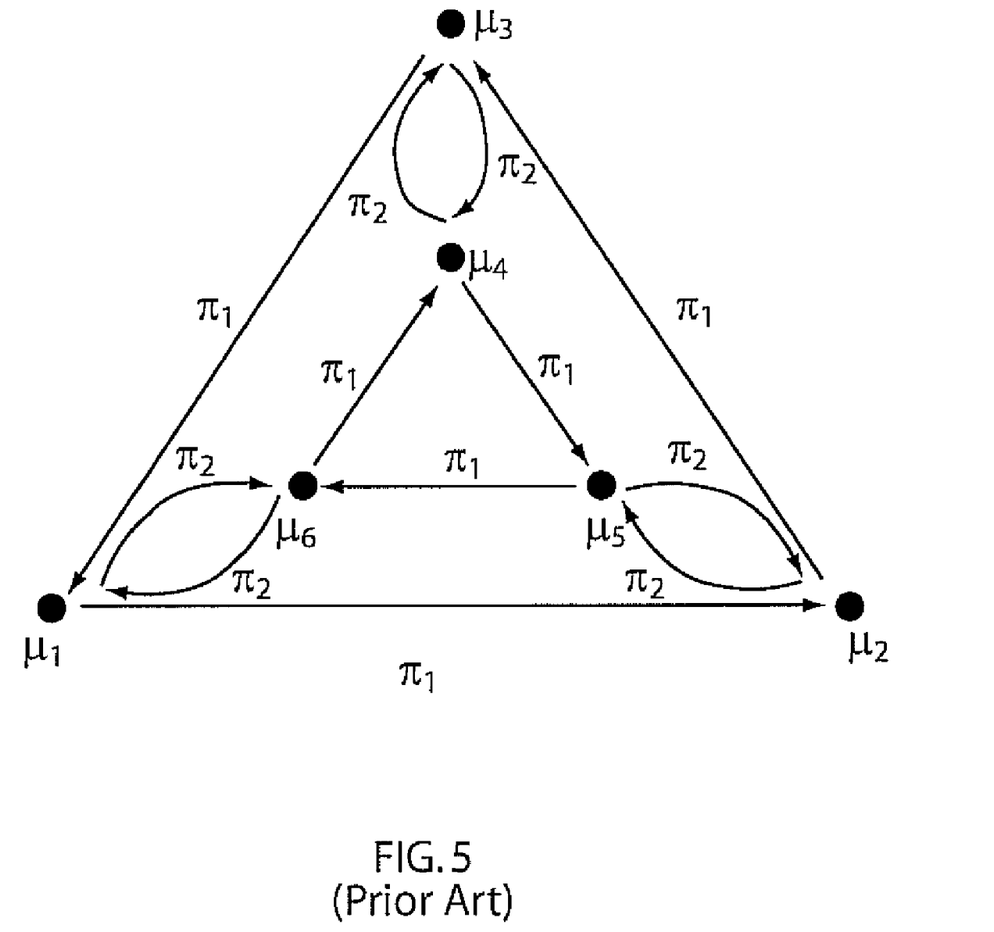
FIG. 5 shows a Cayley graph for two permutations and 6 elements in accordance with the prior art.

Referring to FIG. 5, an example given by Viola et al. for an Eulerian cycle in a Cayley graph for a symmetric group $S_3$ generated by two permutations $\pi_1=(1,2,3)$ and $\pi_2=(1,2)$ is shown. The group has six elements $\mu_1, \ldots, \mu_6$ which are in correspondence with the effects that the decoupling sequence has on the system. Here, there are only two pulses that have to be applied to the system, namely $\pi_1=(1,2,3)$ and $\pi_2=(1,2)$. The order in which they are applied is given by an Eulerian cycle. A possible cycle is given by the sequence ($\pi_1, \pi_1, \pi_1, \pi_2, \pi_1, \pi_2, \pi_2, \pi_1, \pi_2, \pi_2, \pi_1, \pi_2$). Note that the sequence visits each directed edge precisely once and visits each node equally often, namely two times.

Figure 6:
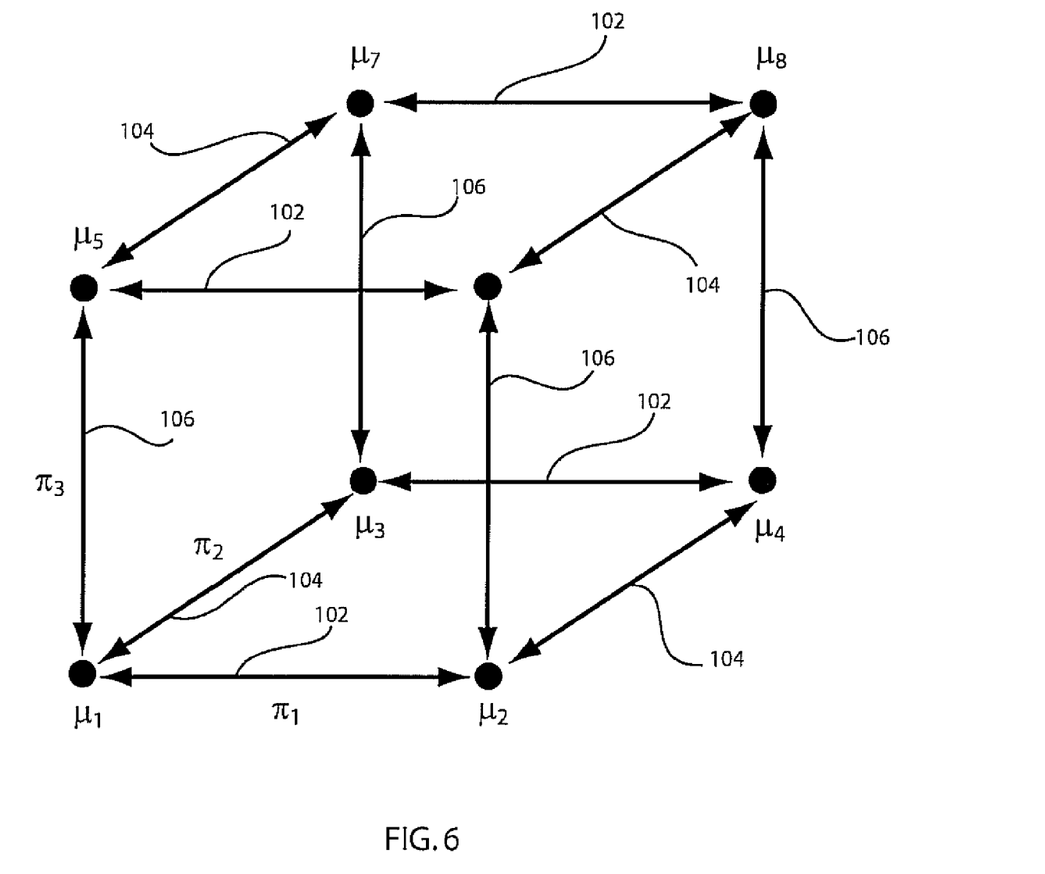
FIG. 6 shows a Cayley graph for three soft pulses and eight group elements in accordance with an illustrative embodiment.

Referring to FIG. 6, as an example, we consider a three dimensional hypercube $\{0,1\}^3$ which is a Cayley graph for the group generated by the elements $\pi_1=(1,0,0)$, shown as edges 102, $\pi_2=(0,1,0)$, shown as edges 104, and $\pi_3=(0,0,1)$, shown as edges 106. Other graphs may also be employed in accordance with the preset principles. The group has eight elements $\mu_1, \ldots, \mu_8$ which correspond with the effects the decoupling sequence has on a system. The pulses which have to be applied to the system are $\pi_1$, $\pi_2$, and $\pi_3$. The order in which these pulses have to be applied is given by an Eulerian cycle. Note that each edge can actually be traveled on in two directions. A possible cycle is given by the sequence of 24 pulses (in abbreviated notation i↔$\pi_i$): 1, 2, 2, 3, 1, 3, 3, 2, 1, 2, 2, 3, 1, 3, 3, 2, 2, 1, 3, 1, 2, 1, 3, 1.

Note that the sequence visits each directed edge precisely once and visits each node equally often, namely three times.

Figure 7:
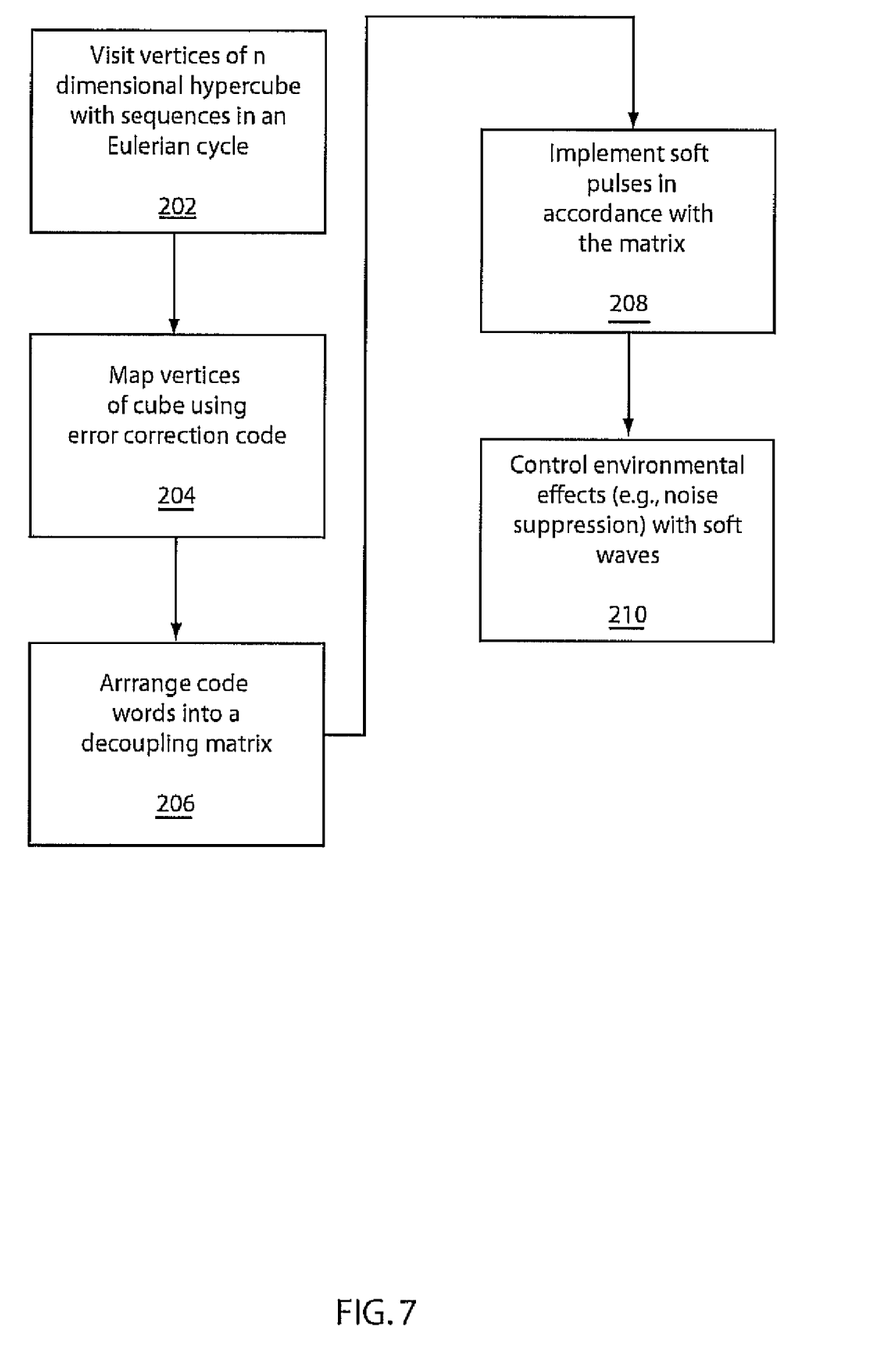
FIG. 7 is a block/flow diagram for a system/method for decoupling a quantum system from environmental effects in accordance with one embodiment.

Referring to FIG. 7, in accordance with a general embodiment, we use sequences which visit the vertices of the n dimensional hypercube in an Eulerian cycle in block 202. It can be shown that such Eulerian cycles always exist in these graphs. Next, the binary strings corresponding to the vertices of the hypercube are mapped using a fixed linear error correcting code C which has to be chosen such that the dual code $C^\perp$ has minimum distance three in block 204.

It is known that the corresponding list of vectors forms an orthogonal array. It has been shown by Roetteler et al. In "Equivalence of decoupling schemes and orthogonal arrays", IEEE Transactions on Information Theory, vol. 52, no. 9, 2006, incorporated herein by reference, that this can be used to define a decoupling scheme. As an example for this connection we use for C the [7, 3, 4] binary Hamming code with generator matrix, G:

$$G = \begin{pmatrix} 1 & 0 & 0 & 1 & 0 & 1 & 1 \\ 0 & 1 & 0 & 1 & 1 & 1 & 0 \\ 0 & 0 & 1 & 0 & 1 & 1 & 1 \end{pmatrix}$$

and put the three rows of G into one-to-one correspondence with $\pi_1$, $\pi_2$, and $\pi_3$. The dual distance of C is three, hence the above outlined method is applicable. In block 206, arranging the code words into the columns of a matrix, we obtain the following 7×8 matrix:

$$\begin{pmatrix} 0 & 1 & 1 & 0 & 0 & 1 & 1 & 0 \\ 0 & 0 & 1 & 1 & 1 & 1 & 0 & 0 \\ 0 & 0 & 0 & 0 & 1 & 1 & 1 & 1 \\ 0 & 1 & 0 & 1 & 1 & 0 & 1 & 0 \\ 0 & 0 & 1 & 1 & 0 & 0 & 1 & 1 \\ 0 & 1 & 0 & 1 & 0 & 1 & 0 & 1 \\ 0 & 1 & 1 & 0 & 1 & 0 & 0 & 1 \end{pmatrix}.$$

FIG. 6 provides an explanation of this particular sequence is obtained. Entries (0 and 1) of this mathematical array (matrix) represent concrete physical objects, namely each column of the matrix encodes uniquely a unitary operation that has to be applied to the system. The coding is 0<–>identity, i.e., no operation is applied, and 1<->bit flip, i.e., the two basis states of a qubit are flipped.

The eight columns of this matrix correspond to the group elements $\mu_1, \ldots, \mu_8$. The whole sequence of 24 pulses given above maps to the following decoupling scheme:

$$\begin{pmatrix} 1 & 1 & 1 & 1 & 0 & 0 & 0 & 0 & 1 & 1 & 1 & 1 & 0 & 0 & 0 & 0 & 1 & 1 & 0 & 0 & 1 & 1 & 0 \\ 0 & 0 & 0 & 1 & 1 & 0 & 1 & 1 & 1 & 1 & 0 & 0 & 1 & 0 & 0 & 0 & 0 & 1 & 1 & 1 & 1 & 0 & 0 \\ 0 & 1 & 0 & 0 & 0 & 0 & 0 & 1 & 1 & 0 & 1 & 1 & 1 & 1 & 0 & 1 & 1 & 1 & 1 & 0 & 0 & 0 & 0 \\ 1 & 1 & 1 & 0 & 1 & 0 & 1 & 1 & 0 & 0 & 0 & 1 & 0 & 1 & 0 & 0 & 0 & 1 & 0 & 1 & 1 & 0 & 1 & 0 \\ 0 & 1 & 0 & 1 & 1 & 0 & 1 & 0 & 0 & 1 & 0 & 1 & 1 & 0 & 1 & 0 & 1 & 1 & 0 & 0 & 1 & 1 & 0 & 0 \\ 1 & 0 & 1 & 0 & 1 & 0 & 1 & 0 & 1 & 0 & 1 & 0 & 1 & 0 & 1 & 0 & 1 & 0 & 1 & 0 & 1 & 0 & 1 & 0 \\ 1 & 0 & 1 & 1 & 0 & 0 & 0 & 1 & 0 & 1 & 0 & 0 & 1 & 1 & 1 & 0 & 1 & 0 & 0 & 1 & 0 & 1 & 1 & 0 \end{pmatrix}$$

The 7 rows of this matrix correspond to a system with seven qubits. The 24 columns correspond to the 24 composite pulses as above, which can be implemented as soft pulses in block 208. The way this matrix is designed, it has the property that whenever two arbitrary rows are picked, all four possible pairs of entries (0,0), (0,1), (1,0), and (1,1) appear the same number of times. Additionally, it has the feature of guaranteed robustness which comes from the fact that it is derived from an Eulerian cycle in a Cayley graph.

In one embodiment, dynamical noise suppression or control of environmental effects are applied to a quantum computing system using soft pulses, which are applied to the system in accordance with the pulse properties defined in the decoupling scheme matrix, in block 210. Advantageously, dynamical noise suppression with soft pulses in accordance with the present principles scales better in terms of a number and type of pulses that have to be applied to the system.

Generalizing this to quantum systems with an arbitrary number n of qubits, there exists an efficient dynamical decoupling scheme with soft pulses which has $O(n \log(n))$ pulses. Such schemes are useful for dynamical decoupling for quantum computers especially once the number of available qubits becomes larger. Further, it is claimed that because the number of different soft pulses to be implemented is only $O(\log(n))$, that the designer of such schemes can focus on implementing only a relatively small number of composite pulses. For the actual design of the soft pulses, any preferred technique for pulse shaping may be employed.

Dynamical decoupling schemes have been devised for a long time in NMR, where techniques such as spin echo and more generally refocusing techniques (e.g., WaHuHa, MREV-8) have been used. Recently, researchers have proposed to use these techniques for decoupling of a system from a harmful environment and for simulation of quantum systems.

The proposed schemes have the number of operations scaled as $O(n^2)$ for systems composed of n qubits. This is still significantly worse than the scaling of the number of operations in accordance with the present principles, which scales as $O(\log(n))$. A consequence of the fact that decoherence times and relaxation times of quantum computers are very short is that only very few operations, such as the individual steps during the execution of a quantum method, can be applied. Hence, it is important to save as much as possible on the overhead that is needed for error-correction and for noise suppression. It is conceivable that a method which utilizes a decoupling technique with $O(n^2)$ number of operations will not be practical because of practical limitations, whereas a sequence that utilizes $O(n/\log n)$ operations can still be implemented since it has a significantly lower overhead in terms of control operations that actually have to be applied to the system.

Also, the constructions of prior art schemes are somewhat ad hoc or do not exploit the full capability of the control groups. The present embodiments show how to derive dynamical decoupling schemes systematically from classical error correcting codes which can be translated into a pulse sequence.

Figure 8:
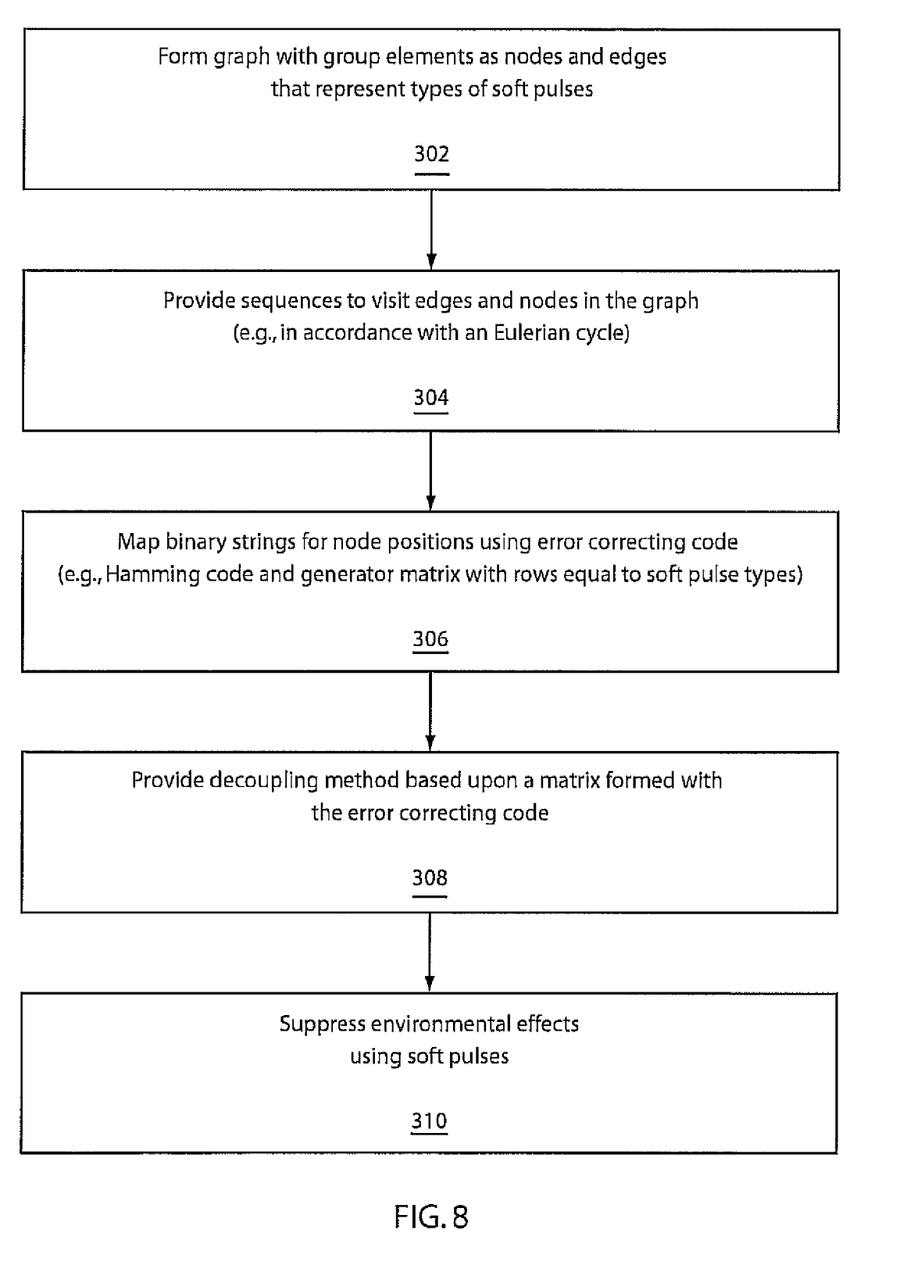
FIG. 8 is a block/flow diagram for another system/method for decoupling a quantum system from environmental effects in accordance with a more detailed embodiment.

Referring to FIG. 8, a system/method for dynamical decoupling of a quantum system is illustratively described. In block 302, a Cayley graph or other graph is formed. The graph includes elements to account for a decoupling sequence effects represented as nodes in the graph. The effects may include noise effects, temperature, disturbances or other environmental effects. Soft pulses that are applied between the nodes are represented as edges in the graph. In the illustrative example, the Cayley graph includes a hypercube with eight nodes for the elements to account for a decoupling sequence effects and three soft pulses each representing four parallel edges in the graph.

In block 304, sequences are provided which visit edges and nodes in the graph. This preferably includes visiting nodes in the graph in accordance with an Eulerian cycle. In block 306, binary strings corresponding to the nodes in a coordinate system are mapped using a fixed linear error correcting code. The fixed linear error correcting code may include a binary Hamming code to form a generator matrix. The generator matrix preferably has a number or rows equal to a number of soft pulse types used.

In block 308, a decoupling method is provided based upon a matrix formed using the error correcting code to determine features of the soft pulses. Each column of the matrix preferably corresponds to the elements to account for the decoupling sequence effects represented as the nodes. The decoupling method preferably suppresses environmental effects, e.g., noise in accordance with soft pulses generated in accordance with the matrix in block 310.

Figure 9:
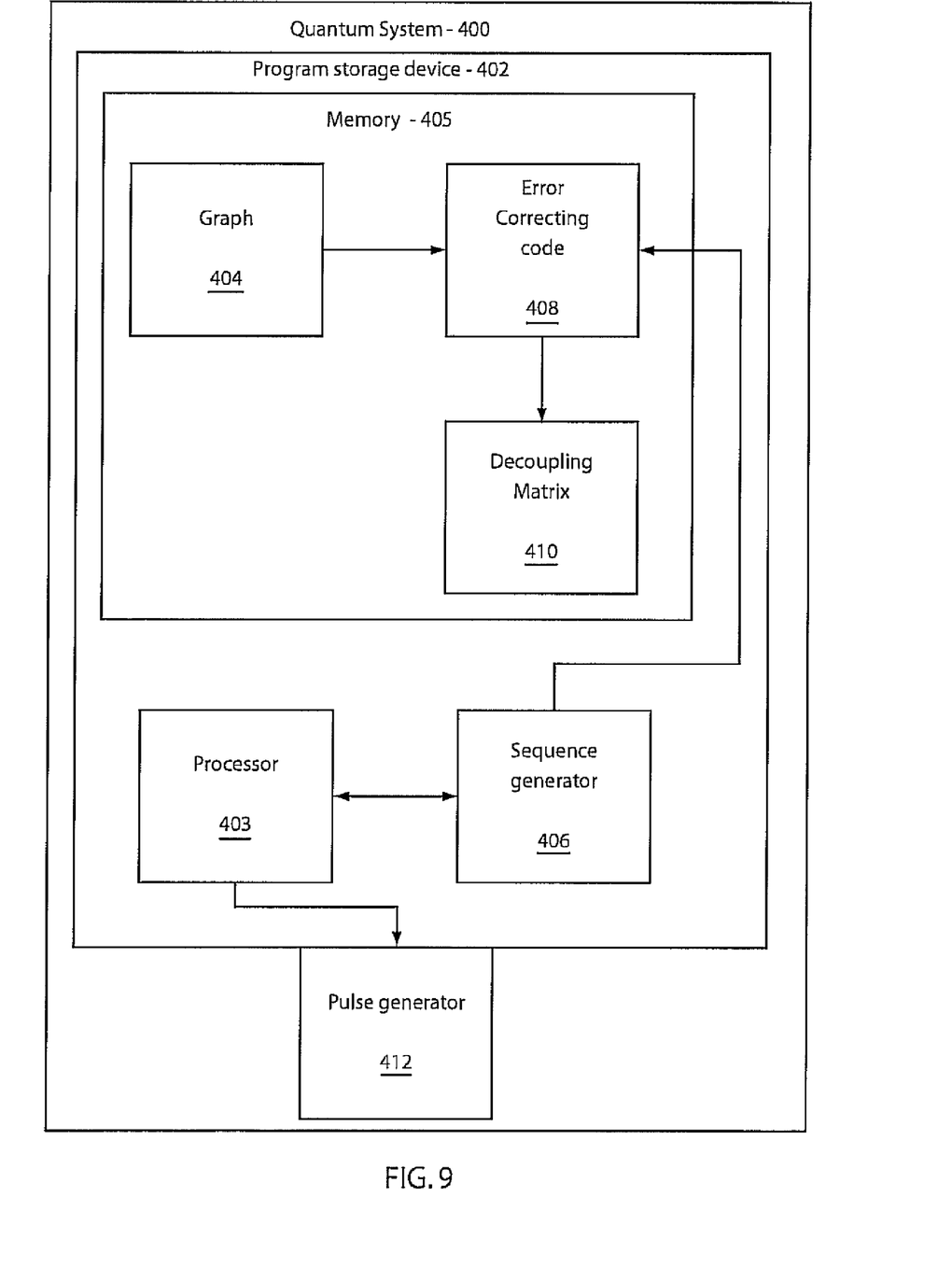
FIG. 9 is a block diagram for a quantum system which employs soft pulses for decoupling the system from environmental effects in accordance with an illustrative embodiment.

Referring to FIG. 9, an illustrative quantum system 400 with dynamical decoupling is shown. A program storage device 402 includes a processor 403 and memory 405. The device 402 is configured to form a Cayley graph 404 including elements to account for a decoupling sequence effects represented as nodes in the graph and soft pulses applied being represented as edges in the graph. A sequence generator 406 generates sequences to visit edges and nodes in the graph in accordance with an Eulerian cycle. A fixed linear error correcting code 408 is stored in memory 405 and configured to map binary strings corresponding to the nodes in a coordinate system. A decoupling matrix 410 is generated using the error correcting code to determine features of the soft pulses where each column of the matrix corresponds to the elements to account for the decoupling sequence effects represented as the nodes. A pulse generator 412 is configured to generate soft pulses in accordance with the matrix to suppress environmental effects on the quantum system.

Having described preferred embodiments of a system and method efficient decoupling schemes for quantum systems using soft pulses (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for dynamical decoupling of a quantum system, comprising:
    selecting a sequence of n log(n) soft pulses;
    forming a graph including elements to account for decoupling sequence effects represented as nodes in the graph and the sequence of n log(n) soft pulses applied being represented as edges in the graph;
    providing sequences which visit edges and nodes in the graph;
    mapping binary strings corresponding to the nodes in a coordinate system using a fixed linear error correcting code; and
    providing a decoupling method based upon a matrix formed using the error correcting code to determine features of the sequence of n log(n) soft pulses to decouple environmental effects from the quantum system.

2. The method as recited in claim 1, wherein forming a graph includes forming a hypercube with eight nodes for the elements to account for a decoupling sequence effects and three soft pulses of the sequence of n log(n) soft pulses each representing four parallel edges in the graph.

3. The method as recited in claim 1, wherein providing sequences includes visiting nodes in the graph in accordance with an Eulerian cycle.

4. The method as recited in claim 1, wherein mapping binary strings corresponding to the nodes in a coordinate system using a fixed linear error correcting code includes using a binary Hamming code to form a generator matrix.

5. The method as recited in claim 4, wherein the generator matrix has a number or rows equal to the sequence of n log(n) soft pulses used.

6. The method as recited in claim 1, wherein providing a decoupling method based upon a matrix formed using the error correcting code includes forming the matrix where each column of the matrix corresponds to the elements to account for the decoupling sequence effects represented as the nodes.

7. The method as recited in claim 1, wherein the decoupling method suppresses noise in accordance with the sequence of n log(n) soft pulses generated in accordance with the matrix.

8. A non-transitory computer readable medium comprising a computer readable program for dynamical decoupling of a quantum system, wherein the computer readable program when executed on a computer causes the computer to perform the steps of:
    selecting a sequence of n log(n) soft pulses;
    forming a graph including elements to account for decoupling sequence effects represented as nodes in the graph and the sequence of n log(n) soft pulses applied being represented as edges in the graph;
    providing sequences which visit edges and nodes in the graph;
    mapping binary strings corresponding to the nodes in a coordinate system using a fixed linear error correcting code; and
    providing a decoupling method based upon a matrix formed using the error correcting code to determine features of the sequence of n log(n) soft pulses to decouple environmental effects from the quantum system.

9. The computer readable medium as recited in claim 8, wherein forming a graph includes forming a hypercube with eight nodes for the elements to account for a decoupling sequence effects and three soft pulses of the sequence of n log(n) soft pulses each representing four parallel edges in the graph.

10. The computer readable medium as recited in claim 8, wherein providing sequences includes visiting nodes in the graph in accordance with an Eulerian cycle.

11. The computer readable medium as recited in claim 8, wherein mapping binary strings corresponding to the nodes in a coordinate system using a fixed linear error correcting code includes using a binary Hamming code to form a generator matrix.

12. The computer readable medium as recited in claim 11, wherein the generator matrix has a number or rows equal to the sequence of n log(n) soft pulses used.

13. The computer readable medium as recited in claim 8, wherein providing a decoupling method based upon a matrix formed using the error correcting code includes forming the matrix where each column of the matrix corresponds to the elements to account for the decoupling sequence effects represented as the nodes.

14. The computer readable medium as recited in claim 8, wherein the decoupling method suppresses noise in accordance with the sequence of n log(n) soft pulses generated in accordance with the matrix.

15. A method for dynamical decoupling of a quantum system, comprising:
    selecting a subset of n log(n) soft pulses;
    forming a Cayley graph including elements to account for a decoupling sequence effects represented as nodes in the graph and the sequence of n log(n) soft pulses applied being represented as edges in the graph;
    providing sequences which visit edges and nodes in the graph in accordance with an Eulerian cycle;
    mapping binary strings corresponding to the nodes in a coordinate system using a fixed linear error correcting code using a binary Hamming code to form a generator matrix; and
    providing a decoupling method based upon a matrix formed using the error correcting code to determine features of the sequence of n log(n) soft pulses where each column of the matrix corresponds to the elements to account for the decoupling sequence effects represented as the nodes.

16. The method as recited in claim 15, wherein forming a Cayley graph includes forming a hypercube with eight nodes for the elements to account for a decoupling sequence effects and three soft pulses of the sequence of n log(n) soft pulses each representing four parallel edges in the graph.

17. The method as recited in claim 15, wherein the generator matrix has a number or rows equal to the sequence of n log(n) soft pulses used.

18. The method as recited in claim 15, wherein the decoupling method suppresses noise in accordance with the sequence of n log(n) soft pulses generated in accordance with the matrix.

19. A quantum system with dynamical decoupling, comprising:

a program storage device comprising a processor and a memory, the program storage device configured to form a graph including elements to account for a decoupling sequence effects represented as nodes in the graph and a subset of n log(n) soft pulses applied being represented as edges in the graph, wherein;

a sequence generator generates sequences to visit edges and nodes in the graph in accordance with an Eulerian cycle;

a fixed linear error correcting code stored in the memory of the program storage device, the fixed linear error correcting code configured to map binary strings corresponding to the nodes in a coordinate system;

a decoupling matrix generated based upon a matrix formed using the error correcting code to determine features of the sequence of n log(n) soft pulses where each column of the matrix corresponds to the elements to account for the decoupling sequence effects represented as the nodes; and a pulse generator configured to generate the sequence of n log(n) soft pulses in accordance with the matrix to suppress environmental effects on the quantum system.

20. The system as recited in claim 19, wherein the sequence of n log(n) soft pulses suppress noise.

* * * * *